United States Patent
Jia et al.

(10) Patent No.: US 9,960,377 B2
(45) Date of Patent: May 1, 2018

(54) COLOR FILTER SUBSTRATE AND FABRICATION METHOD THEREOF, OLED STRUCTURE, RELATED DISPLAY PANEL, AND RELATED DISPLAY DEVICE

(71) Applicant: BOE TECHNOLOGY GROUP CO., LTD, Beijing (CN)

(72) Inventors: Wenbin Jia, Beijing (CN); Xinwei Gao, Beijing (CN); Guangcai Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days. days.

(21) Appl. No.: 15/325,262

(22) PCT Filed: Oct. 29, 2015

(86) PCT No.: PCT/CN2015/093194
§ 371 (c)(1),
(2) Date: Jan. 10, 2017

(87) PCT Pub. No.: WO2017/070891
PCT Pub. Date: May 4, 2017

(65) Prior Publication Data
US 2017/0294614 A1    Oct. 12, 2017

(51) Int. Cl.
*H01L 51/50* (2006.01)
*H01L 27/32* (2006.01)
*H01L 51/56* (2006.01)

(52) U.S. Cl.
CPC .......... *H01L 51/5012* (2013.01); *H01L 27/32* (2013.01); *H01L 51/56* (2013.01)

(58) Field of Classification Search
CPC ............... H01L 27/3246; H01L 27/322; H01L 27/3211; H01L 51/5268
See application file for complete search history.

(56) References Cited

U.S. PATENT DOCUMENTS 7,687,989 B2    3/2010    Cok

FOREIGN PATENT DOCUMENTS

| CN | 104218183 A | 12/2014 |
| CN | 104659075 A | 5/2015 |
| WO | 2015083823 A1 | 6/2015 |

OTHER PUBLICATIONS

The World Intellectual Property Organization (WIPO) International Search Report for PCT/CN2015/093194 dated Jul. 20, 2016 p. 1-12.

*Primary Examiner* — Joseph L Williams
(74) *Attorney, Agent, or Firm* — Anova Law Group, PLLC

(57) ABSTRACT

The present disclosure provides a color filter substrate used in an organic light-emitting diode (OLED) or liquid crystal (LC) display structure for improving a contrast ratio and light output. The color filter substrate includes a substrate; a color filter layer comprising a plurality of pixel units; and a reflective metallic matrix comprising a plurality of reflective metallic matrix elements surrounding each pixel unit.

20 Claims, 3 Drawing Sheets

US 9,960,377 B2

COLOR FILTER SUBSTRATE AND FABRICATION METHOD THEREOF, OLED STRUCTURE, RELATED DISPLAY PANEL, AND RELATED DISPLAY DEVICE

This PCT patent application is a national phase entry under 35 U.S.C. § 371 of International Applicator No. PCT/CN2015/093194, filed on Oct. 29, 2015, the entire content of which is incorporated by reference herein.

FIELD OF THE INVENTION

The present invention generally relates to the display technologies and, more particularly, relates to a color filter substrate, and a fabrication method thereof, OLED structure, related display panels, and related display devices.

BACKGROUND

OLED display devices, with advantages such as low energy consumption, high luminance, short response time, wide viewing angle, and light weight, have been broadly used in devices such as mobile communication terminals, personal digital assistants (PDAs) and tablet computers. OLED display devices are classified into the passive matrix type and active matrix type. The active matrix type OLED display devices utilize thin film transistors (TETs) to drive OLEDs.

A white organic light emitting diode (WOLED) device provides high resolution and large scale displays, and can be used in a backlight of a liquid crystal display (LCD) device or a full color display device employing color filters. White OLED and other top-emitting display devices have relatively high aperture ratios, but the light output and viewing angles of these display devices are not ideal. To output colored light, a color filter substrate is used to filter white light generated by the OLED layer. The color filter substrate includes color filters and a black matrix formed on a glass substrate of the display panel. When the emitted light enters the glass substrate, the black matrix structure would absorb part of the light to reduce the reflection and improve the contrast ratio of the OLED display.

However, a conventional black matrix absorbs light, including the diffused light generated by many pixels, which may reduce the brightness levels of the display panels. Further, conventional black matrix is often made of heavy metals, such as chromium. Such materials pollute the environment. In addition, the processes implemented to clean up manufacturing wastes containing heavy metals are often burdensome and costly.

It is therefore desirable to improve the designs of OLED/LC structures to reduce pollution in the manufacturing processes, and to improve contrast ratios and view angles of the display panels.

BRIEF SUMMARY OF THE DISCLOSURE

The present disclosure provides an OLED/LC structure and fabrication method thereof, and related display panels and display devices. By using the disclosed color filter substrate, the light output and the contrast ratio of an OLED/LC display panel can be improved. Further, the manufacturing process according to the embodiments of the present disclosure is cleaner and therefore more economical.

One aspect of the present disclosure provides a color filter substrate. The color filter substrate includes a substrate; a color filter layer comprising a plurality of pixel units; and a reflective metallic matrix comprising a plurality of reflective metallic matrix elements surrounding each pixel unit.

Optionally, each reflective metallic matrix element includes a reflective surface facing each adjacent pixel unit. The reflective surface forms an acute angle with the substrate.

Optionally, the reflective surface may form an acute angle of about 30 to 60° with a bottom surface of the metal matrix element contacting the substrate.

Optionally, the reflective metallic matrix elements comprise pyramid shaped metallic elements with reflective surfaces.

Optionally, the reflective metallic elements comprise frustum shaped metallic elements with reflective surfaces.

Optionally, the color filter layer is thinner than the reflective metallic matrix.

Optionally, the color filter substrate includes a protection layer covering the reflective metallic matrix and the color filter layer.

Optionally, a thickness of the protection layer is about 2 um to 4 um.

Optionally, the color filter substrate includes light diffusers dispensed on the protection layer.

Optionally, the light diffusers may be transparent. The light diffusers may be light scattering particles with diameters of about 20 nm to 80 nm. The light diffusers are selected from one or a combination of $SiO_2$ and $TiO_2$.

The pixel units include blue pixel units, red pixel units, green pixel units, and white pixel units.

Another aspect of the present disclosure provides an OLED structure for improving a contrast ratio and light output. The OLED structure includes an OLED array substrate. The OLED array substrate includes a thin-film transistor (TFT) substrate with a TFT layer; and an OILED layer formed on the TFT substrate, the OLED layer emitting light. The OLED structure further includes a color filter substrate. The color filter substrate includes a substrate; a color filter layer comprising a plurality of pixel units; and a reflective metallic matrix comprising a plurality of reflective metallic elements surrounding each pixel unit.

Optionally, each reflective metallic matrix element includes a reflective surface facing each adjacent pixel unit. The reflective surface forms an acute angle with the substrate.

Optionally, the reflective surface may form an acute angle of about 30° to 60° with a bottom surface of the metal matrix element contacting the substrate.

Optionally, the reflective metallic matrix elements comprise pyramid shaped metallic elements with reflective surfaces.

Optionally, the reflective metallic elements comprise frustum shaped metallic elements with reflective surfaces.

Optionally, the color filter layer is thinner than the reflective metallic matrix.

Optionally, the color filter substrate includes a protection layer covering the reflective metallic matrix and the color filter layer.

Optionally, a thickness of the protection layer is about 2 μm to 4 μm.

Optionally, the color filter substrate includes light diffusers dispensed on the protection layer.

Optionally, the light diffusers may be transparent. The light diffusers may be light scattering particles with diameters of about 20 nm to 80 nm. The light diffusers are selected from one or a combination of $SiO_2$ and $TiO_2$.

The pixel units include blue pixel units, red pixel units, green pixel units, and white pixel units.

Another aspect of the present disclosure provides a method for fabricating a color filter substrate.

The method for fabricating the color filter substrate includes forming a reflective metallic matrix in an active region of a cover glass, wherein each metallic matrix element is of a pyramid shape; forming pixel units in the active region of the cover glass; forming a protection layer on the pixel units and the reflective metallic matrix; and dispensing light diffusers on the protection layer.

Further, each reflective metallic matrix element includes a reflective surface facing each adjacent pixel unit. The reflective surface forms an acute angle with a bottom surface of the metal matrix element contacting the substrate. Optionally, the reflective surface may form an acute angle of about 30° to 60° with the substrate.

Optionally, the reflective metallic matrix elements comprise pyramid shaped metallic elements with reflective surfaces.

Optionally, the reflective metallic elements comprise frustum shaped metallic elements with reflective surfaces.

Further, the color filter layer is thinner than the reflective metallic matrix.

Another aspect of the present disclosure provides a display panel including the color filter substrate described above.

Another aspect of the present disclosure provides a display device including the above-mentioned display panel.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

Color filters in OLED/LC structures need to have a high degree of color purity, optical transmittance, and optical tolerance, with little or no discoloration or fading over time, as well as high thermal stability and chemical resistance. A color filter may also be referred to as a pixel unit. The two terms are used interchangeably in the present disclosure. To reduce pixel light crosstalk, pixel units are often interposed with a black matrix.

Instead of a conventional black matrix, embodiments of the present disclosure provide a color filter substrate with a highly reflective metallic matrix that can be used with pixel units. The metallic matrix forms a pattern of lines on the color filter substrate that shields bus lines and TFTs from the viewable area of the display. These lines distinguish red, green, or blue (RGB) pixels to prevent pixel crosstalk and light leakage, thus improving the contrast ratio. Further, the metallic matrix is a layer only a few microns thick. Thus, it has little impact on the aperture ratio.

The metallic matrix may be formed by reflective metallic materials, such as certain metals including copper (Cu), silver (Ag), etc. The metallic matrix is highly reflective also because each element of the metallic matrix is of a pyramid shape or similar shapes. The shape of the metallic matrix elements further enables the metallic matrix to reflect scattered light to the adjacent pixel units, increasing the light output of the display panel. Moreover, the metallic matrix is thicker than the pixel units on the color filter substrate, which prevents light mixings between light going through different pixel units.

In addition, the color filter substrate according to embodiments of the present disclosure further includes a layer of light diffusers dispensed on top of the pixel units and the metallic matrix. The light diffusers scatter light emitted by the luminescent layer. The diffused light is then reflected by the metallic matrix and transmitted out of the display panel through the pixel units.

One aspect of the present disclosure provides a color filter substrate that is used in an OLED/LC structure.

Figure 1A:
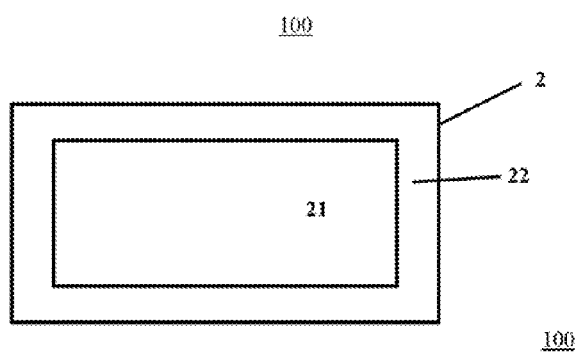
FIG. 1a is a top view of an exemplary cover glass according to embodiments of the present disclosure.
Figure 1B:
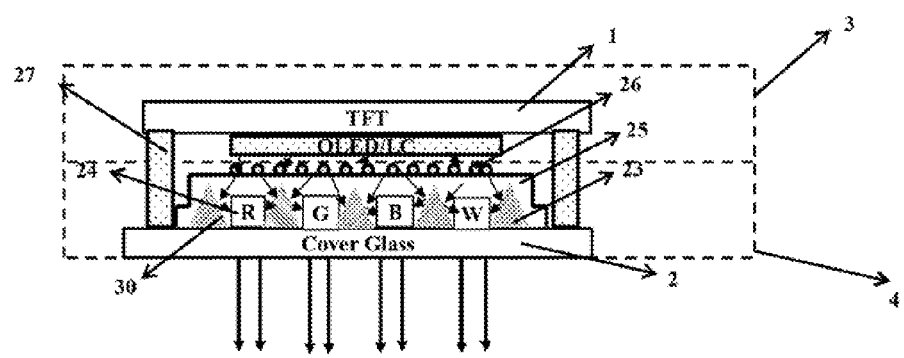
FIG. 1b illustrates a cross sectional view of an exemplary display panel according to embodiments of the present disclosure.

FIGS. 1a and 1b illustrate an exemplary OLED/LC structure 100 according to various embodiments of the present disclosure. As shown in FIG. 1b, the OLED/LC structure 100 includes a cover glass 2 bonded with the TFT substrate 1, encapsulating a number of functional layers. Specifically, FIG. 1a shows a top/front view of the cover glass 2. The cover glass 2 includes an active region 21, in which an image is displayed on the display panel during operation. The cover glass 2 also includes a peripheral region 22, in which no image is displayed during operation.

As shown in FIG. 1b, the OLED/LC structure 100 includes an OLED array substrate 3 according to embodiments of the present disclosure. The OLED array substrate 3 includes a TFT substrate 1 with TFTs disposed on it and an OLED/LC layer formed over the TFTs.

The OLED/LC layer is a luminescent layer. In some embodiments, the OLED/LC layer may be disconnected by certain barriers. In other embodiments, the OLED/LC layer may be formed integrally in one layer. In one example, the OLED/LC layer may be an OLED layer sandwiched by a cathode layer and an anode layer. The array of electrodes may be controlled by the TFT circuitry in the TFT layer.

The OLED/LC structure 100 further includes a color filter substrate 4. The color filter substrate 4 includes a cover glass 2. The cover glass 2 includes an active region 21 and a peripheral region 22. The active region 21 may be, for example, a rectangular region in the center of the cover glass 2 in which display pixels are actively used to display images. The peripheral region 22 may be devoid of active display pixels. In the example of FIG. 1a, the peripheral region 22 has the shape of a rectangular ring, surrounding the periphery of active region 21. Circuitry and other components may sometimes be formed in the peripheral region 22. To hide the circuitry and other components from view by a user of the display device, the peripheral region 22 may sometimes be provided with an opaque mask. The opaque mask can be formed from an opaque material such as a black material or may be formed from opaque masking materials of other colors.

The color filter substrate 4 further includes pixel units 24. The pixel units 24 may be red (R), green (G), blue (B), and/or white (W). The pixel units 24 may form a color filter layer. The array of pixel units 24 in the color filter layer may be used to provide the display panel with the ability to display color images.

The color filter substrate 4 further includes a reflective metallic matrix 23. The metallic matrix 23 is interposed between the pixel units 24. The metallic matrix 23 masks light leaked from the space between the pixel units 24. To enhance reflectance, the metallic matrix 23 may be made of metallic materials that have a high reflectance, such as aluminum (Al), aluminum alloy, copper (Cu), silver (Ag), titanium (Ti), etc., and/or a combination of the metallic materials.

In the active region 21, metallic matrix 23 may be formed from a grid of relatively thin lines. The metallic matrix 23 may have a pattern of openings such as an array of rectangular holes for receiving pixel units 24. In some embodiments, in the peripheral region 22, metallic matrix material may be used in forming a peripheral metallic matrix that serves as a black border for the display. For example, the metallic matrix in the peripheral region 22 may have a rectangular ring shape that surrounds a central rectangular active region 21. In some embodiments, in the peripheral region 22, black matrix material may be used in forming a peripheral black matrix that serves as a black border for the display.

In one embodiment of the present disclosure, each element of the metallic matrix 23 may be pyramid shaped, as shown in FIG. 1b. Compared to other shapes, the pyramid shaped metallic matrix 23 may reflect more light into the pixel units 24 and thus enables more light emitted by the OLED/LC layer to be transmitted through the pixel units 24. The elements of metallic matrix 23 may be of a right pyramid shape, a non-right pyramid shape, square pyramid shape, triangular prism shape, etc. In some embodiments, the metallic matrix 23 elements may be frustums. In FIG. 1b, the arrows pointing down from the cover glass 2 indicate the direction of the light output of the display panel.

As shown in FIG. 1b, each metallic matrix 23 element provides reflective surfaces 30 that reflect light into the adjacent pixel units 24. In one embodiment, the metallic matrix 23 element may be a square pyramid with four reflective surfaces 30. Each reflective surface 30 faces one pixel unit 24. Each reflective surface 30 may form an acute angle with the cover glass 2. For example, each reflective surface 30 may form an angle of about 30°-60° with the cover glass 2.

In one embodiment, as shown in FIG. 1b, the thickness of the pixel units 24 may be thinner than the thickness of the metallic matrix 23. In one embodiment, the thickness of the pixel units 24 may be thinner than the thickness of the metallic matrix 23 by 1 μm to 2 μm. Such a configuration enables the metallic matrix 23 to reflect scattered light into pixel units 24, therefore increases light output of the display panel.

The shape of the metallic matrix 23 element according to the present disclosure is not limited to those disclosed in the present disclosure. The angle formed by the reflective surfaces of the metallic matrix 23 elements with the cover glass, according to the present disclosure, is not limited to those disclosed in the present disclosure. Embodiments of the present disclosure provide metallic matrix 23 with elements of the metallic matrix 23 being of any shape that may improve the light transmission rate or contrast ratio of the display panel. The shape of the metallic matrix 23 elements and the angles formed between the reflective surfaces 30 of the metallic matrix 23 and the cover glass 2 may be adjusted to achieve various design objectives in light transmission rate, contrast ratio, manufacturing cost, etc.

The size of the elements of the metallic matrix 23 according to the present disclosure is not limited to those disclosed in the present disclosure. In embodiments of the present disclosure, any size of the metallic matrix 23 elements that can be properly interposed between the pixel units 24 may be appropriate for the color filter substrate. The thickness of the metallic matrix 23 elements can be adjusted to achieve different design objectives in light transmission rate, manufacturing cost, etc.

The composition of the metallic matrix 23 may also be adjusted according to various designs and applications. Embodiments of the present disclosure provide metallic matrix with elements of the metallic matrix be made of any metal or other materials, or a combination thereof, that may improve the light transmission rate or the contrast ratio of the display panel.

The color filter substrate 4 further includes a protection layer 25. For example, the protection layer 25 is substantially transparent and can be formed of a resin. The protection layer 25 encapsulates the pixel units 24 and the metallic matrix 23 on the surface of the cover glass 2, protects the pixel units 24 and the metallic matrix 23 from the external environment, and thus limits damages caused by environmental factors such as oxygen and moisture.

The protection layer 25 should be of an appropriate thickness. If the protection layer 25 is too thin, it may not provide sufficient insulation to the external environment. If the protection layer 25 is too thick, it may lead to increased opacity and deterioration of light transmission efficiency. In some embodiments, the protection layer 25 may be around 2 um-4 um thick.

In addition, the color filter substrate 4 further includes light diffusers 26. In one embodiment, the light diffusers 26 may be dispensed onto the protection layer 25. Light generated by the OLED/LC layer may be scattered by the light diffusers 26 to reach the color filter substrate 4 and be transmitted through the pixel units 24. The light diffusers 26 are another element for effectively improving the light output and viewing angle of the display panel.

The light diffusers 26 may be light scattering particles, each having a diameter of about 30 nm to about 80 nm. The light diffusers 26 may be transparent. If light is incident to fine particles, such as the light diffusers 26, light is generally scattered. In a case where a diameter of a particle is less than $1/10$ of a light wavelength, forward scattering and backward scattering similarly occur. Forward scattering refers to when light scatters in a direction in which light travels. Backward scattering refers to when light scatters in a direction in which light is reflected. This is referred to as Rayleigh scattering.

However, in a case where the diameter of the particle is greater than $1/10$ of the light wavelength, Mie scattering, in which the forward scattering overwhelmingly occurs compared to the backward scattering, is induced. In some embodiments, the light diffusers 26 induce Mie scattering to allow the forward scattering to overwhelmingly occur, which improves the viewing angle characteristics due to more light scattering, while not impairing light transmission efficiency.

To induce Mie scattering, the light diffusers 26 need to have diameters greater than $1/10$ of a corresponding light wavelength. In consideration of a wavelength of light generated by the OLED/LC layer, the light diffusers 26 may need to have diameters greater than 4 nm-70 nm.

As described above, the different sizes of the light diffusers 26 may cause various light scattering effect. In some embodiments of the present disclosure, the light diffusers 26 may have diameters of about 20 nm-80 nm. The light diffusers 26 may be made of polystyrene (PS), silicon dioxide (SiO2), titanium dioxide (TiO2), etc. The light diffusers 26 may be dispensed on top of the protection layer 25 by a sol-gel method or a microemulsion method. The composition and diameters of the light diffusers 26 may be adjusted according to various designs and applications to achieve different light transmitting effects.

As shown in FIG. 1b, the OLED array substrate is bonded with the color filter substrate 4 through a sealant 27. In some embodiments, the sealant 27 may be a UV-curing sealant 27. The UV-curing sealant 27 may be applied in the peripheral region 22 of the cover glass 2. The OLED array substrate 3 and color filter substrate 4 may subsequently be pressed together. The UV-curing sealant 27 may then be cured by applying UV light to the sealant.

Another aspect of the present disclosure provides a method for fabricating art color filter substrate that is used in an OLED/LC structure according to various embodiments of the present disclosure.

Figure 2:
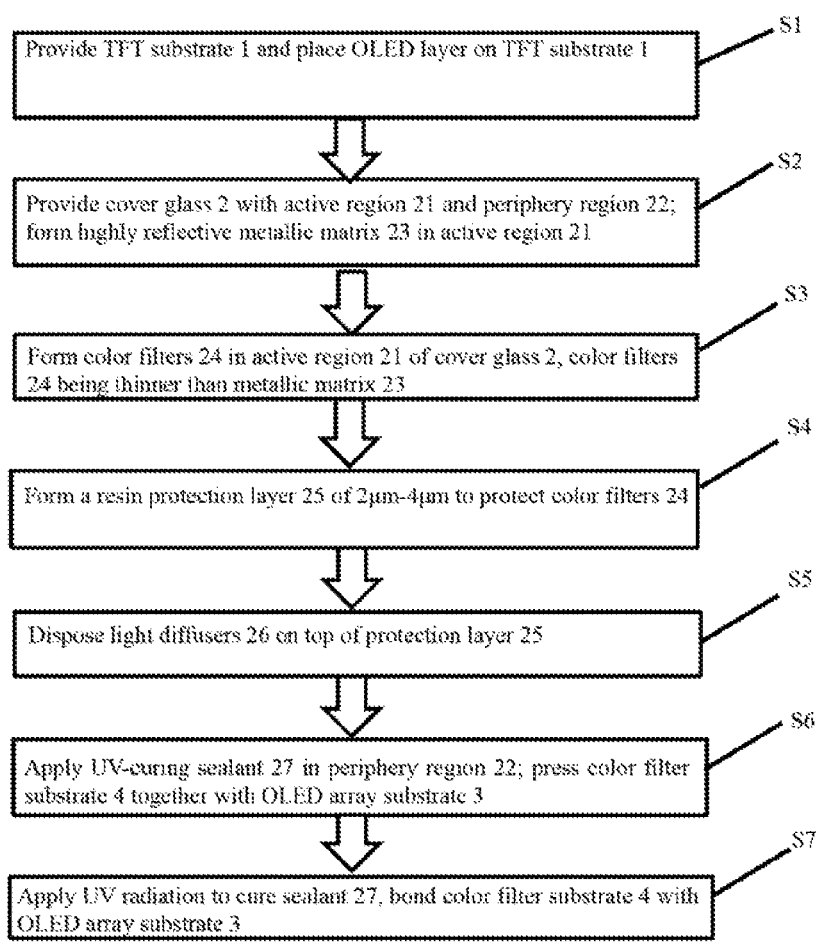
FIG. 2 illustrates an exemplary process flow for fabricating OLED/LC structure according to embodiments of the present disclosure.
Figure 3:
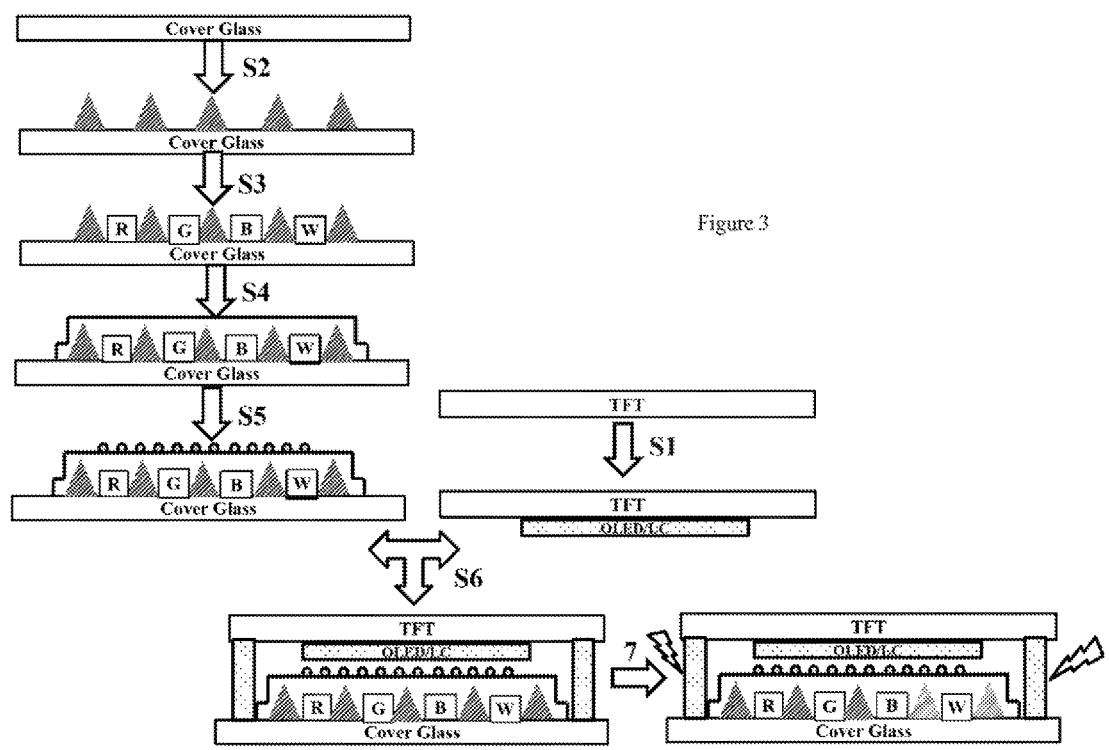
FIG. 3 illustrates exemplary components described in the process flow of FIG. 2.

FIG. 2 illustrates an exemplary process for fabricating the OLED/LC structure discussed in relation to FIGS. 1a and 1b. The process may include steps S1 to S7. FIG. 3 further illustrates exemplary components that are fabricated through each step of the exemplary process described in FIG. 2.

In step S1, a TFT substrate 1, i.e., a substantially transparent substrate with a TFT layer formed on the substrate, is provided. Further, as shown in FIG. 3, an OLED/LC layer is formed on top of the TFT layer. The OLED/LC layer is a luminescent layer. In some embodiments, the OLED/LC layer may be disconnected by certain barriers. In other embodiments, the OLED/LC layer may be formed integrally in one layer.

In step S2, a cover glass 2 is provided. The cover glass 2 includes an active region 21 and a peripheral region 22. A metallic matrix 23 may be formed in the active region 21.

Further, in step S2, as shown in FIG. 3, a reflective metallic matrix 23 is formed in the active region 21 of cover glass 2. In some embodiments, a metallic matrix may be formed in the peripheral region 22. In other embodiments, a conventional black matrix may be formed in the peripheral region 22.

A metallic matrix 23 may be formed by a photolithography process. First, a pattern comprising a metallic matrix 23 is formed in the active region 21 of cover glass 2. Then, a protection layer is deposited on the cover glass 2. The protection layer may be, for example, silicon nitride (SiNx) or silicon oxide (SiOx) (e.g., $SiN_2$ or $SiO_2$). The part of the protection layer corresponding to the metallic matrix 23 is then etched by a patterning process. The metallic matrix 23 is then formed over the active region 21.

In one example, to enhance reflectance, the metallic matrix 23 may be formed with metallic materials that has a high reflectance, such as aluminum (Al), aluminum alloy, copper (Cu), silver (Ag), silver alloy, titanium (Ti), etc.

In one embodiment of the present disclosure, each element of the metallic matrix 23 may be pyramid shaped, as shown in FIG. 3. The pyramid shaped metallic matrix 23 reflects more light into the pixel units 24 and thus enables more light emitted by the OLED/LC layer to be transmitted through the pixel units 24.

The shape of the elements of the metallic matrix 23 according to the present disclosure is not limited to those disclosed in the present disclosure. Embodiments of the present disclosure provide a metallic matrix with elements of the metallic matrix 23 that can be of any shape that may improve the light transmission rate or contrast of the display panel. The shape of the metallic matrix 23 elements may be adjusted to achieve various design objectives in light transmission rate, contrast ratio, manufacturing cost, etc.

In step S3, pixel units 24 are disposed in the active region 21 of the cover glass 2. As shown in FIG. 3, the pixel units 24 may be red (R), green (G), blue (B), and white (W) pixels. The metallic matrix 23 is interposed between the pixel units 24. The metallic matrix 23 masks light leaked from spaces disposed between the pixel units 24.

In one embodiment, as shown in FIG. 3, the thickness of the pixel units 24 may be thinner than the thickness of the metallic matrix 23. Such a configuration enables the metallic matrix 23 to reflect more scattered light into pixel units 24, therefore increases the light output of the display panel.

In step S4, a protection layer 25, such as a resin layer, is formed to cover and protect the pixel units 24 and metallic matrix 23 from the external environment. In one embodiment, a thickness of the protection layer 25 may be around 2 μm-4 μm. The protection layer 25 may be formed using a screen printing method, a drip coating method, a lamination coating method, etc.

In step S5, light diffusers 26 may be dispensed on top of the protection layer 25. The light diffusers 26 may need to have diameters greater than 40 nm-70 nm. In one embodiment, the light diffusers 26 may have diameters of about 20 nm-80 nm. The light diffusers 26 may be made of polystyrene (PS), silicon dioxide (SiO2), titanium dioxide (TiO2), etc. The light diffusers 26 may be dispensed on top of the protection layer 25 by a sol-gel method or a microemulsion method.

In step S6, a sealant 27, such as a UV-curing sealant 27, is applied around the edge of the cover glass 2, in the peripheral region 22. As shown in FIG. 3, the color filter substrate 4 is then pressed together with the OLED array substrate 3. In some embodiments, sealant 27 may be applied along the edges of the OLED array substrate 3 before the color filter substrate 4 and the OLED array substrate 3 are pressed together.

In step S7, a light, such as a UV light is applied on the UV-curing sealant 27 to cure the sealant. The OLED array substrate 3 and the color filter substrate 4 are then bonded.

Another aspect of the present disclosure provides a display panel.

The disclosed color filter substrate and the related OLED/LC structure may be used in a display panel. In some embodiments, the display panel may be an LCD display panel. In some embodiments, the display panel may be an OLED display panel. In some embodiments, the display panel may include the OLED array substrate 3 and the color filter substrate 4. The color filter substrate 4 may include pixel units 24 with interposed reflective metallic matrix 23.

Another aspect of the present disclosure provides a display device.

The display device may incorporate the display panel described above. The display device according to the embodiments of the present disclosure may be used in any product with display functions such as a television, an LCD display, an OLED display, an electronic paper, a digital photo frame, a mobile phone, a tablet computer, a navigation device, etc.

For descriptive purposes, only certain elements of the OLED/LC structure are illustrated and describe in the embodiments described in the present disclosure. Certain elements of the OLED/LC structure, such as certain circuits, are known in the art and not repeated herein. It should be understood that other elements of the OLED/LC structure that are understood by and known to a person of ordinary skill in the art are within the scope of the present disclosure.

Any reference in this specification to "one embodiment," "an embodiment," "example embodiment," "some embodiments," etc., indicates that a particular feature, structure, or characteristic described in connection with the embodiment is included in at least one embodiment of the invention. The appearances of such phrases throughout the specification are not necessarily all referring to the same embodiment. Further, when a particular feature, structure, or characteristic is described in connection with any embodiment, it is noted that it is within the purview of one skilled in the art to effect such feature, structure, or characteristic in connection with other embodiments.

It should be understood that the above embodiments disclosed herein are exemplary only and not limiting the scope of this disclosure. Without departing from the spirit and scope of this invention, other modifications, equivalents, or improvements to the disclosed embodiments are obvious to those skilled in the art and are intended to be encompassed within the scope of the present disclosure.

What is claimed is:

1. A color filter substrate, comprising:
   a substrate;
   a color filter layer comprising a plurality of pixel units; and
   a reflective metallic matrix comprising a plurality of reflective metallic matrix elements surrounding each pixel unit,
   wherein:
      each of the metallic matrix elements has a bottom surface proximate to the substrate and larger than a top surface away from the substrate, and
      a whole of each of the reflective metallic matrix elements is made of a same metallic material.

2. The color filter substrate of claim 1, wherein each reflective metallic matrix element includes a reflective surface facing each adjacent pixel unit.

3. The color filter substrate of claim 2, wherein the reflective surface forms an acute angle with a bottom surface of the metal matrix element contacting the substrate.

4. The color filter substrate of claim 3, wherein the reflective surface forms an acute angle of about 30° to 60°.

5. The color filter substrate according to claim 1, wherein the reflective metallic matrix elements comprise pyramid shaped metallic elements with reflective surfaces.

6. The color filter substrate according to claim 1, wherein the reflective metallic elements comprise frustum shaped metallic elements with reflective surfaces.

7. The color filter substrate according to claim 1, wherein the color filter layer is thinner than the reflective metallic matrix.

8. The color filter substrate according to claim 1, further comprising a protection layer covering the reflective metallic matrix and the color filter layer.

9. The color filter substrate according to claim 8, wherein a thickness of the protection layer is about 2 µm to 4 µm.

10. The color filter substrate according to claim 8, further comprising light diffusers dispensed on the protection layer.

11. The color filter substrate according to claim 10, wherein the light diffusers are transparent.

12. The color filter substrate according to claim 10, wherein the light diffusers are light scattering particles with diameters of about 20 nm to 80 nm.

13. The color filter substrate according to claim 10, wherein the light diffusers are selected from one or a combination of $SiO_2$ and $TiO_2$.

14. The color filter substrate according to claim 1, wherein the pixel units comprise blue pixel units, red pixel units, green pixel units, and white pixel units.

15. An organic light-emitting diode device (OLED) structure for improving a contrast ratio and light output, comprising:
   an OLED array substrate including:
      a thin-film transistor (TFT) substrate with a TFT layer;
      an OLED layer formed on the TFT substrate, the OLED layer emitting light; and
      a color filter substrate including:
         a substrate;
         a color filter layer comprising a plurality of pixel units; and
         a reflective metallic matrix comprising a plurality of reflective metallic elements surrounding each pixel unit,
         wherein:
            each of the metallic matrix elements has a bottom surface proximate to the substrate and larger than a top surface away from the substrate, and
            a whole of each of the reflective metallic matrix elements is made of a same metallic material.

16. The OLED structure according to claim 15, wherein each reflective metallic matrix element includes a reflective surface facing each adjacent pixel unit.

17. The OLED structure according to claim 16, wherein the reflective surface forms an acute angle with a bottom surface of the element contacting the substrate.

18. The OLED structure according to claim 17, wherein the reflective surface forms an acute angle of about 30° to 60°.

19. A method for fabricating a color filter substrate, comprising:
   forming a reflective metallic matrix including a plurality of reflective metallic matrix elements in an active region of a cover glass, wherein:
      each of the reflective metallic matrix elements is of a pyramid shape having a bottom surface proximate to the cover glass and larger than a top surface away from the cover glass, and
      a whole of each of the metallic matrix elements is made of a same metallic material;
   forming pixel units in the active region of the cover glass, the plurality of reflective metallic matrix elements surrounding each of the pixel units;
   forming a protection layer to cover the pixel units and the reflective metallic matrix; and
   dispensing light diffusers on the protection layer.

20. A display panel, including the color filter substrate according to claim 1.

* * * * *